United States Patent [19]

Kirsch

[11] Patent Number: 4,472,644
[45] Date of Patent: Sep. 18, 1984

[54] BOOTSTRAPPED CLOCK DRIVER INCLUDING DELAY MEANS

[75] Inventor: Howard C. Kirsch, Colorado Springs, Colo.

[73] Assignee: Mostek Corporation, Carrollton, Tex.

[21] Appl. No.: 329,586

[22] Filed: Dec. 10, 1981

[51] Int. Cl.³ .................. H03K 5/135; H03K 17/284; H03K 17/693
[52] U.S. Cl. ................................. 307/269; 307/578; 307/583; 307/601
[58] Field of Search ................ 307/443, 453, 480–482, 307/542, 548, 550, 246, 575, 577, 578, 583, 584, 264, 269, 591, 594, 601

[56] References Cited

U.S. PATENT DOCUMENTS

| | | | |
|---|---|---|---|
| 4,061,933 | 12/1977 | Schroeder et al. | 307/269 X |
| 4,071,783 | 1/1978 | Knepper | 307/270 |
| 4,239,990 | 12/1980 | Hong et al. | 307/246 X |
| 4,250,408 | 2/1981 | Spence | 307/542 |
| 4,309,630 | 1/1982 | Young, Jr. | 307/443 X |
| 4,317,051 | 2/1982 | Young, Jr. | 307/246 |
| 4,347,448 | 8/1982 | Plachno | 307/583 |
| 4,379,974 | 4/1983 | Plachno | 307/269 |
| 4,382,194 | 5/1983 | Nakano et al. | 307/482 X |
| 4,388,538 | 6/1983 | Ikeda | 307/482 |

Primary Examiner—Larry N. Anagnos
Assistant Examiner—David R. Hudspeth

[57] ABSTRACT

A clock generator circuit (10) receives an input signal PPCØ and generates a delayed clock output signal PCØ. The circuit (10) is set to an initial condition by a precharge signal PCØR prior to a transition of the input signal PPCØ. A time delay signal is produced at a node (26) by operation of transistors (18, 28). The transition of the input signal PPCØ produces a bootstrapped voltage at a capacitor (68). The delay signal activates a transistor (80) to couple the bootstrapped voltage to the gate terminal of an output transistor (88). The gate terminal of the output transistor (88) is driven directly from a low voltage state to a boosted high voltage state. This causes the output signal PCØ to be driven from an initial low voltage state to the power supply voltage $V_{cc}$ without intervening steps. The output transistors (88, 90) of circuit (10) are never activated at the same time, thereby preventing any current spike from being propagated through the circuit (10).

7 Claims, 2 Drawing Figures

BOOTSTRAPPED CLOCK DRIVER INCLUDING DELAY MEANS

TECHNICAL FIELD

The present invention pertains to electronic clock signal generation circuits and more particularly to such circuits which are utilized in integrated circuits.

BACKGROUND OF THE INVENTION

Clock signal generator circuits are utilized extensively in semiconductor memories. The clock signals generated by these circuits serve to sequence the operation of the memory. A clock signal frequently must drive a heavy capacitive load while maintaining a rapid transition rate. The driver transistors for such clock circuits must therefore be relatively large. The timing in the operation of conventional clock circuits can cause an overlap in the turn-on of the driver transistors, thereby creating a heavy current spike which can be detrimental to the circuit. This is often the result when capacitive bootstrapping is used to produce a high voltage drive signal for the output transistors.

In view of the above problems there exists a need for a clock circuit which can produce a desired clock signal with a rapid transition rate but prevents the occurrence of current spikes through the clock circuit.

SUMMARY OF THE INVENTION

A selected embodiment of the clock circuit of the present invention includes a capacitor together with means for precharging the capacitor to a first voltage state. An output transistor is provided to drive an output terminal. Circuit means are provided for precharging the output terminal to a first voltage level. An input signal is provided to circuitry which operates to boost the voltage across the capacitor to a second voltage state which is greater than the first voltage state. Circuit means are provided for generating a delay signal which is derived from the input signal. Further circuit means are provided which operate in response to the delay signal for coupling the second voltage state from the capacitor to the control terminal for the output transistor to thereby drive the output terminal to a second voltage level.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1:
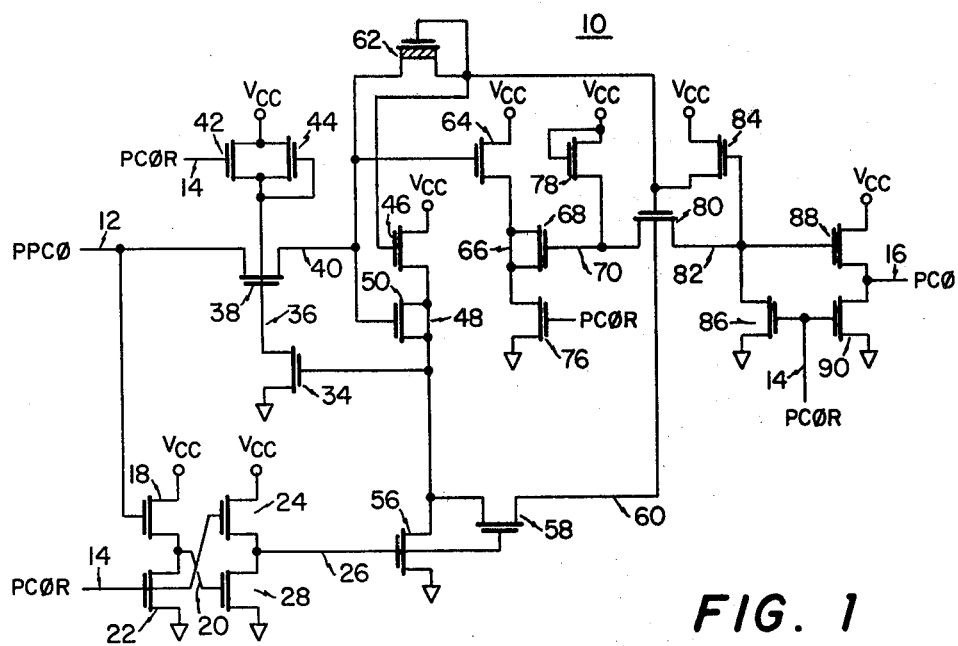
FIG. 1 is a schematic illustration of a clock signal generator circuit in accordance with the present invention.
Figure 2:
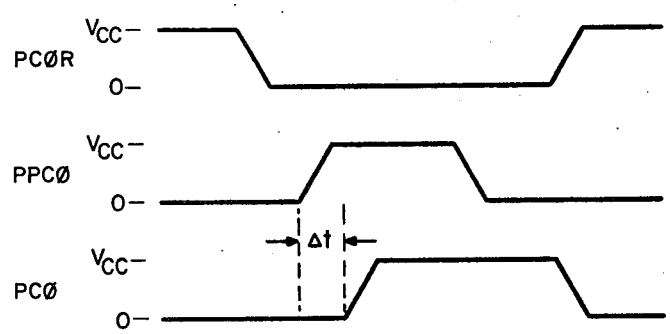
FIG. 2 is an illustration of signal wave forms which occur for the circuit shown in FIG. 1.

A clock generator circuit 10 in accordance with the present invention is illustrated in FIG. 1. The input and output signals for circuit 10 are illustrated in FIG. 2. Referring now to FIGS. 1 and 2, an input signal PPC∅ is provided to a node 12. A precharge signal PC∅R is input to a node 14. An output signal PC∅ is produced at an output node 16.

The node 12 is connected to the gate terminal of a transistor 18 which has its drain terminal connected to a power terminal $V_{cc}$ and its source terminal connected to a node 20. The node 14 is connected to the gate terminal of transistors 22 and 24. The drain terminal of transistor 22 is connected to node 20 and the source terminal is connected to ground. The drain terminal of transistor 24 is connected to the power terminal $V_{cc}$ and the source terminal of transistor 24 is connected to a node 26. The node 20 is connected to the gate terminal of a transistor 28 which has the drain terminals connected to node 26 and the source terminal grounded. The combination of transistors 18, 22, 24 and 28 comprise a delay circuit which produces a delayed output signal at node 26 following a transistion of the input signal PTC∅ at node 12.

A transistor 34 has its drain terminal connected to a node 36 and its source terminal grounded. A transistor 38 has its gate terminal connected to node 36 and its drain and source terminals connected between node 12 and a node 40. The precharge signal PC∅R is provided to the gate terminal of a transistor 42 which has its drain terminal connected to power terminal $V_{cc}$ and its source terminal connected to node 36. Transistor 42 serves to precharge node 36. A transistor 44 has its drain terminal connected to $V_{cc}$ and its gate and source terminals connected to node 36. Transistor 44 serves to limit the maximum voltage excursion of node 36.

A transistor 46 has its drain terminal connected to $V_{cc}$ and its source terminal connected to a node 48. A capacitor 50 comprises a transistor which has its source and drain terminals connected to node 48 and its gate terminal connected to node 40.

A transistor 56 has its gate terminal connected to node 26, its drain terminal connected to node 48 and its source terminal grounded.

A transistor 58 has its gate terminal connected to node 26 and its drain and source terminals connected between node 48 and a node 60. The gate terminal of transistor 46 is connected to node 60.

A depletion transistor 62 has its source and drain terminals connected between node 40 and node 60 with its gate terminal also connected to node 60. Transistor 62 functions essentially as a resistor.

A transistor 64 has its gate terminal connected to node 40, its drain terminal connected to $V_{cc}$ and its source terminal connected to a node 66.

A capacitor 68 comprises a transistor which has its drain and source terminals connected to node 66 and its gate terminal connected to a node 70.

The precharge signal PC∅R is further input to the gate terminal of a transistor 76 which has its drain terminal connected to node 66 and its source terminal grounded.

A transistor 78 has its gate and drain terminals connected to power terminal $V_{cc}$ and its source terminal connected to node 70.

Node 60 is further connected to the gate terminal of a transistor 80 which has its drain and source terminals connected between node 70 and a node 82. Transistor 80 serves to couple node 70 to node 82.

A transistor 84 has its drain terminal connected to power terminal $V_{cc}$ and its source terminal connected to node 60. The gate terminal of transistor 84 is connected to the node 82.

A transistor 86 has its drain terminal connected to node 82, its source terminal grounded and its gate terminal connected to node 14 to receive the precharge signal PC∅R. A pull-up output transistor 88 has its gate terminal connected to node 82, its drain terminal connected to the power terminal $V_{cc}$ and its source terminal connected to the output node 16.

A pull-down transistor 90 has its gate terminal connected to node 14 for receiving the precharge signal PCØR. The drain terminal of transistor 90 in connected to the output node 16 and the source terminal of transistor 90 is grounded.

For the embodiment of the present invention illustrated in FIG. 1 each of the transistors is an N-channel type, however, the circuit 10 can equally well be carried out with the use of P-channel type transistors.

Operation of the clock generator circuit 10 of the present invention is now described in reference to FIGS. 1 and 2. The wave forms in FIG. 2 show one cycle of operation of circuit 10. In the initial condition, the precharge signal PCØR is at a high voltage state while the input signal PPCØ and the output signal PCØ are at a low voltage state. Under these signal conditions, the circuit 10 is set to an initial or reset state. The reset condition is described as follows. The PCØR signal turns on transistor 22 which serves to pull node 20 to a low voltage state, thereby turning off transistor 28. The PCØR signal turns on transistor 24, thereby pulling node 26 to a high voltage state. The high voltage at node 26 turns on transistor 56 to pull node 48 to a low voltage state. The combination of low state at node 48 and high state at node 26 turns on transistor 58 which in turn pulls node 60 to a low voltage state. The low voltage state on node 48 further serves to turn off transistor 34 to permit transistor 42 to pull node 36 to a high voltage state. This in turn renders transistor 38 conductive to drive node 40 to a low voltage state which corresponds to the initial state of the signal PPCØ.

The signal PCØR is provided to the gate terminal of transistor 76 to pull node 66 to a low state. The precharge signal PCØR is further provided to turn on transistor 86 to pull node 82 to a low voltage state. Transistor 90 is rendered conductive to pull the output node 16 to a low voltage state. The gate terminal of transistor 88 receives a low voltage to cause transistor 88 to be nonconductive such that there is no conducting path between the power terminals through the output transistors 88 and 90.

The transistor 78 is connected to pull the voltage at node 70 up to approximately one threshold voltage below $V_{cc}$. The low voltage state at node 40 serves to turn off transistor 64 thus allowing node 66 to be pulled to ground. There is thus produced a first voltage state across the capacitor 68. This voltage state is essentially equal to $V_{cc}-V_T$ where $V_T$ represents one threshold voltage.

The above described reset condition is established before each triggering pulse is received for the signal PPCØ. The voltage states at each of the nodes described above is maintained even after the precharge signal PCØR returns to the low voltage level. Each of the nodes is permitted to float at its precharged voltage level.

The circuit 10 produces a predetermined time delay between the positive transitions of the input signal PPCØ and the output signal PCØ as shown in FIG. 2. This time delay is produced by the action of transistors 18 and 28. The sizes of transistors 18 and 28 serve to establish the duration of the time delay, $\Delta t$, as shown in FIG. 2.

When the input signal PPCØ makes its positive transistion transistor 18 will be driven toward a more conductive state which tends to pull node 20 to a higher voltage level. As the voltage at node 20 increases, transistor 28 becomes more conductive, which causes node 26 to begin to be discharged. The time required for the above-described action to reach a final state for transistors 18 and 28 is essentially the time delay, $\Delta t$, between the input and output signals for the circuit 10. There is thus produced a delay signal at node 26.

When the input signal PPCØ makes its positive transistion, the voltage at node 36 will be bootstrapped through transistor 38 to a higher voltage level above $V_{cc}$. However, the transistor 44 is connected to function as a diode which limits the maximum excursion of node 36 to $V_{cc}+V_T$. By limiting the maximum voltage at the gate terminal of transistor 38, the bootstrapped voltage produced at node 40 will not be dissipated backward into node 12.

During the time period when the input signal PPCØ is high and the voltage at node 26 remains high, the nodes 12, 40 and 60 are driven to a high voltage state thus charging capacitor 50 to a voltage of $V_{cc}$ between terminals 40 and 48.

When node 26 goes to a low voltage state, transistor 56 is turned off while transistor 46 is on. This serves to pull the voltage of node 48 to $V_{cc}$ thus boosting the voltage at node 40 to a maximum of 2 $V_{cc}$. The high voltage state at node 48 turns on transistor 34 thereby pulling the gate terminal of transistor 38 to a low level which serves to turn off transistor 38. When transistor 38 is turned off, node 40 is isolated, thus permitting it to be maintain at the boosted voltage state.

When node 40 is boosted above $V_{cc}$ transistor 64 pulls node 66 to approximately $V_{cc}$. This in turn serves to boost the voltage at node 70 to a maximum of 2 $V_{cc}$ $-V_T$ through the coupling of capacitor 68.

The elevated voltage on node 40 is transmitted through transistor 62 to node 60.

When node 82 is driven to one $V_T$ above $V_{cc}$ transistor 84 is made conductive to pull node 60 down to $V_{cc}$. This action serves to decouple node 82 from node 70. Thus, node 82 cannot driven higher than $V_{cc}+V_T$. The inclusion of transistor 84 in circuit 10 reduces the current spike which could occur during the reset portion of the cycle but it is not necessary for the functional operation of the circuit.

Node 82 is driven to the elevated voltage state after signal PCØR has turned off transistors 86 and 90. Thus when node 82 receives the elevated voltage transistor 88 is turned on and the output clock signal PCØ is driven from essentially ground to $V_{cc}$ in a single step. The signal PCØ remains at a high state until the precharge signal PCØR transitions from the low to high state.

The signal PPCØ returns to the low voltage state but the output signal PCØ is maintained at the high voltage state due to the charge condition of the nodes in the circuit 10. The circuit 10 is reset when the precharge signal PCØR transitions from the low to the high voltage state. The high voltage state of signal PCØR turns on transistors 86 and 90. The turn on of transistor 86 pulls node 82 to a low voltage state, thereby turning off the output transistor 88. The turn on of transistor 90 serves to pull the output node 16 to a low voltage state. With the precharge signal in the high voltage state the circuit 10 is reestablished in the reset condition described above.

It has heretofore been a problem in certain prior art clock circuits that the output transistors, which correspond essentially to transistors 88 and 90, could be rendered conductive at the same time thus producing a substantial current spike through the circuit. Note that with the circuit 10 of the present invention the output transistors 88 and 90 are never in a conductive state at the same time, thereby preventing the generation of such a current spike.

A further problem with prior art clock circuits is that the output clock level is not smoothly transitioned from the low to the high state. In such circuits the output pull-down transistor corresponding to transistor 90 is typically three to four times larger than the output pull-up transistor corresponding to transistor 88. When both output transistors are both momentarily on, the clock output is driven from the ground state to a level slightly above ground due to the size ratio of the output transistors. When the pull-down transistor turns off the output is driven from the state slightly above ground to the full $V_{cc}$ by means of capacitive boosting. This step type operation, however, creates an irregular clock transition which can degrade the performance of the circuitry that receives the clock signal. Note that with the circuit 10 the gate terminal of the output transistor 88 is held at essentially ground and with the turn on of transistor 80 is immediately driven to an elevated voltage state $V_{cc}+V_T$. This action turns on the output transistor 88 and immediately cause the node 16 to be driven from a low voltage state to full $V_{cc}$ with no intermediate transition step. This produces a much cleaner and faster clock signal.

All of the transistors in circuit 10 are N-channel devices, however, a circuit equivalent to circuit 10 can be fabricated with P-channel devices.

In summary, the present invention comprises a clock generator circuit which receives an input signal and produces a time delayed output clock signal. The control voltage for the output driver transistor is held at a low voltage state and in a single step is driven to an elevated voltage, thereby causing the output clock signal to have a single rapid transition from the low to the high voltage state. Further, the output transistors are operated such that they are never on concurrently, thereby eliminating the possibility of generating a heavy current spike through the clock circuit.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. A clock circuit comprising:
   a capacitor,
   means for precharging a first terminal of said capacitor to a first voltage level while a second terminal of said capacitor is held at a relatively constant voltage,
   an output transistor having its main current conducting path connected between an output node and a supply voltage terminal for receiving a supply voltage,
   means for precharging said output node to a second output voltage level such that said output node is effectively isolated from all other nodes of the circuit, including the supply voltage terminals, when an input signal is received,
   means responsive to said input signal for boosting the voltage across at said second terminal of said capacitor to thereby boost the voltage level at said first terminal of said capacitor to a second voltage level,
   means for generating a delay signal derived from said input signal, and
   means reponsive to said delay signal for coupling said second voltage level from said first terminal of said capacitor to the control terminal of said output transistor to drive said output node to said first output voltage level.

2. A clock circuit, comprising:
   a first capacitor;
   means for precharging a first terminal of said first capacitor to a first votage level while a second terminal of said first capacitor is held at a relatively constant voltage;
   a second capacitor;
   means for precharging a first terminal of said second capacitor to a second voltage level while a second terminal of said second capacitor is held at a relatively constant voltage;
   an output transistor having its main current conducting path connected between an output node and a supply voltage terminal for receiving a supply voltage;
   a coupling transistor for coupling said first terminal of said second capacitor to the control terminal of said output transistor;
   means for precharging said output node to a second output voltage level;
   means for generating a delay signal derived from an input signal;
   means responsive to said input signal for boosting the voltage at said second terminal of said first capacitor to thereby boost the voltage at said first terminal of said first capacitor to a third voltage level and for boosting the voltage at said second terminal of said second capacitor to thereby boost the voltage at said first terminal of said second capacitor to a fourth voltage level; and
   means responsive to the generation of said delay signal for coupling said third voltage level produced across said first terminal of said first capacitor to the control terminal of said coupling transistor to couple said fourth voltage level to the control terminal of said output transistor to drive said output node to said first output voltage level.

3. A clock circuit, comprising:
   a first capacitor;
   a first coupling transistor connected between an input node and a first terminal of said first capacitor;
   means for precharging the control terminal of said first coupling transistor to connect said input node to the first terminal of said first capacitor while a second terminal of said first capacitor is held at a relatively constant voltage;
   means for precharging second terminal of said first capacitor to a first voltage level while said first terminal of said first capacitor is held at a relatively constant voltage;
   a second capacitor;
   means for precharging a first terminal of said second capacitor to said first voltage level while a second terminal of said second capacitor is held at a relatively constant voltage;

means for precharging said second terminal of said second capacitor to a second voltage level while said first terminal of said second capacitor is held at a relatively constant voltage;

means connected to receive an input signal through said input node for generating a delay signal having a transition which is time delayed from a transistion of said input signal going from a first input voltage level to a second input voltage level;

means connected to said first terminal of said first capacitor for driving the voltage at said second terminal of said first capacitor to said second voltage level in response to the transistion of said input signal to said second input voltage level;

means connected to said first terminal of said second capacitor and responsive to the transistion of said input signal to said second input voltage level for driving said first terminal of said second capacitor to said second input voltage level to boost the voltage at said second terminal of said second capacitor to a third voltage level;

means responsive to said delay signal and connected to said second terminal of said first capacitor for boosting the voltage at said first terminal of said first capacitor to a fourth voltage level;

an output transistor having its main current conducting path connected between an output node and a supply voltage terminal for receiving a supply voltage;

a second coupling transistor connected between said second terminal of said second capacitor and the control terminal of said output transistor;

means for precharging said output node to a second output voltage level; and means for transmitting said fourth voltage level at said first terminal of said first capacitor to the control terminal of said second coupling transistor to couple said third voltage level at said second terminal of said second capacitor to the control terminal of said output transistor to drive said output node to said first output voltage level.

4. A clock circuit comprising:

an input node for receiving input signals;

means connected to said input node for generating a time delay signal derived from said input signal and time delayed therefrom;

a first transistor having the source and drain terminals thereof connected between said input node and a first node;

a second transistor having a source and drain terminals thereof connected between the gate terminal of said first transistor and a first power terminal and the gate terminal thereof connected to a second node;

a third transistor having the drain and source terminals thereof connected between a second power terminal and the gate terminal of said first transistor and the gate terminal thereof connected to receive a precharge signal;

a fourth transistor having the drain and source terminals thereof connected between said second power terminal and the gate terminal of said first transistor and the gate terminal thereof connected to the gate terminal of said first transistor;

a first capacitor having a first terminal connected to first node and a second terminal connected to said second node;

a fifth transistor having the drain and source terminals thereof connected between said second power terminal and said second node and the gate terminal thereof connected to said first node;

a sixth transistor having the gate terminal thereof connected to the output of said means for generating a delay signal, and the gate and drain terminals thereof connected between said second node and said first power terminal;

a seventh transistor having the gate terminal thereof connected to the output of said means for generating a delay signal and the drain and source terminals thereof connected between said second node and a third node;

an eighth transistor having the drain and source terminals thereof connected between said first node and said third node and the gate terminal thereof connected to said third node;

a second capacitor having a first terminal thereof connected to a fourth node and a second terminal thereof connected to a fifth node;

a ninth transistor having the gate terminal thereof connected to said first node and the drain and source terminals thereof connected between said second power terminal and said fourth node;

a tenth transistor having the gate terminal thereof connected to receive said precharge signal and the drain and source terminals thereof connected between said fourth node and said first power terminal;

an eleventh transistor having the gate terminal thereof connected to said second power terminal and the source and drain terminals thereof connected between said second power terminal and said fifth node;

a twelfth transistor having the gate terminal thereof connected to said third node and the drain and source terminals thereof connected between said fifth node and a sixth node;

a thirteenth transistor having the gate terminal thereof connected to receive said precharge signal and the source and drain terminals thereof connected between said sixth node and said first power terminal;

a fourteenth transistor having the gate terminal thereof connected to said sixth node and the drain and source terminals thereof connected between said second power terminal and an output node; and a fifteenth transistor having the gate terminal thereof connected to receive said precharge signal and the source and drain terminals thereof connected between said output node and said first power terminal wherein an output signal is generated at said output node.

5. The clock circuit recited in claim 4 including a sixteenth transistor having the gate terminal thereof connected to said sixth node and the drain and source terminals thereof connected between said second power terminal and said third node.

6. A method for generating a clock signal, comprising the steps of:

precharging a first terminal of a capacitor to a first voltage level while a second terminal of said capacitor is held at a relatively constant voltage;

precharging an output node to a first output voltage level such that said output node is effectively isolated from all other nodes of the circuit, including the supply voltage terminals when an input signal is received;

boosting the voltage on said second terminal of said capacitor to thereby boost the voltage on said first terminal of said capacitor to a second voltage level in response to said input signal;

generating a delay signal derived from said input signal; and coupling said second voltage level to the control terminal of an output transistor in reponse to said delay signal said output transistor connected between said output node and a supply voltage of a second input voltage level to drive said output node from said first output voltage level to said second output voltage level.

7. A method for generating a clock signal comprising the steps of:

precharging a first terminal of a first capacitor to a first voltage level while a second terminal of said first capacitor is held at a relatively constant voltage;

precharging a first terminal of a second capacitor to a second voltage level while a second terminal of said second capacitor is held at a relatively constant voltage;

precharging an output node to said first output voltage level;

boosting the voltage on said second terminal of said second capacitor to thereby boost the voltage on said first terminal of said second capacitor to a third voltage level in response to said input signal;

generating a delay signal derived from said input signal;

boosting the voltage on said second terminal of said first capacitor to thereby boost the voltage on said first terminal of said first capacitor to a fourth voltage level in response to said delay signal;

coupling said third voltage level to the control terminal of an output transistor in response to the generation of said fourth voltage level, said output transistor connected between said output node and a supply voltage of a second output voltage level; and driving said output node to said second output voltage level when said fourth voltage level is coupled to the control terminal of said output transistor.

* * * * *